(12) United States Patent
Ando et al.

(10) Patent No.: US 10,256,719 B2
(45) Date of Patent: Apr. 9, 2019

(54) POWER SUPPLY DEVICE

(71) Applicant: DENSO CORPORATION, Kariya, Aichi-pref. (JP)

(72) Inventors: Keiichi Ando, Kariya (JP); Yuichi Handa, Kariya (JP); Kimikazu Nakamura, Kariya (JP); Kaoru Koketsu, Kariya (JP); Yuki Yamada, Kariya (JP); Seiji Iyasu, Kariya (JP); Shuji Kurauchi, Kariya (JP)

(73) Assignee: DENSO CORPORATION, Kairya (JP)

( * ) Notice: Subject to any disclaimer, the term of this patent is extended or adjusted under 35 U.S.C. 154(b) by 0 days.

(21) Appl. No.: 16/061,012

(22) PCT Filed: Nov. 16, 2016

(86) PCT No.: PCT/JP2016/083956
§ 371 (c)(1),
(2) Date: Jun. 11, 2018

(87) PCT Pub. No.: WO2017/104339
PCT Pub. Date: Jun. 22, 2017

(65) Prior Publication Data
US 2018/0367031 A1    Dec. 20, 2018

(30) Foreign Application Priority Data
Dec. 18, 2015   (JP) .................... 2015-247539

(51) Int. Cl.
*H02M 1/44*    (2007.01)
*H02M 3/335*   (2006.01)
(Continued)

(52) U.S. Cl.
CPC .............. *H02M 1/44* (2013.01); *H01F 27/24* (2013.01); *H01F 27/28* (2013.01);
(Continued)

(58) Field of Classification Search
CPC . H02M 3/33507; H02M 3/3382; H02M 7/003
(Continued)

(56) References Cited

U.S. PATENT DOCUMENTS

2002/0003715 A1   1/2002  Matsumoto et al.
2005/0189566 A1*  9/2005  Matsumoto ....... H02M 3/33538
                                                          257/200
(Continued)

FOREIGN PATENT DOCUMENTS

EP    0 954 058 A2     11/1999
JP    2013-215053 A    10/2013

OTHER PUBLICATIONS

Feb. 7, 2017 Search Report issued in International Patent Application No. PCT/JP2016/083956.

*Primary Examiner* — Gary A Nash
(74) *Attorney, Agent, or Firm* — Oliff PLC

(57) ABSTRACT

A power supply device includes a transformer, a primary semiconductor component, a secondary semiconductor component, a choke coil and a circuit board. Electronic components which include the transformer, the primary semiconductor component, the secondary semiconductor component, and the choke coil, are stacked in pairs, in a normal direction of a board. One pair forms a first stacked body and another pair to forms a second stacked body. A circuit board is interposed between the one pair of electronic components which forms the first stacked body, and also between the other pair of electronic components which forms the second stacked body.

20 Claims, 16 Drawing Sheets

(51) Int. Cl.
*H01F 27/24* (2006.01)
*H05K 1/11* (2006.01)
*H01F 27/28* (2006.01)
*H05K 1/18* (2006.01)
*H02M 3/338* (2006.01)
*H02M 7/00* (2006.01)

(52) U.S. Cl.
CPC ........ *H02M 3/33576* (2013.01); *H05K 1/115* (2013.01); *H05K 1/184* (2013.01); *H02M 3/3382* (2013.01); *H02M 3/33507* (2013.01); *H02M 7/003* (2013.01)

(58) Field of Classification Search
USPC .................. 363/21.02, 21.03, 22, 78, 147
See application file for complete search history.

(56) References Cited

U.S. PATENT DOCUMENTS

| | | | |
|---|---|---|---|
| 2012/0112866 A1 | 5/2012 | Matsumoto | |
| 2014/0233281 A1* | 8/2014 | Goto | H02M 7/003 |
| | | | 363/39 |
| 2014/0233282 A1* | 8/2014 | Ohoka | H02M 1/14 |
| | | | 363/39 |
| 2014/0254206 A1* | 9/2014 | Ou | H02M 3/33592 |
| | | | 363/21.01 |
| 2015/0036388 A1* | 2/2015 | Handa | H02M 3/28 |
| | | | 363/15 |

\* cited by examiner

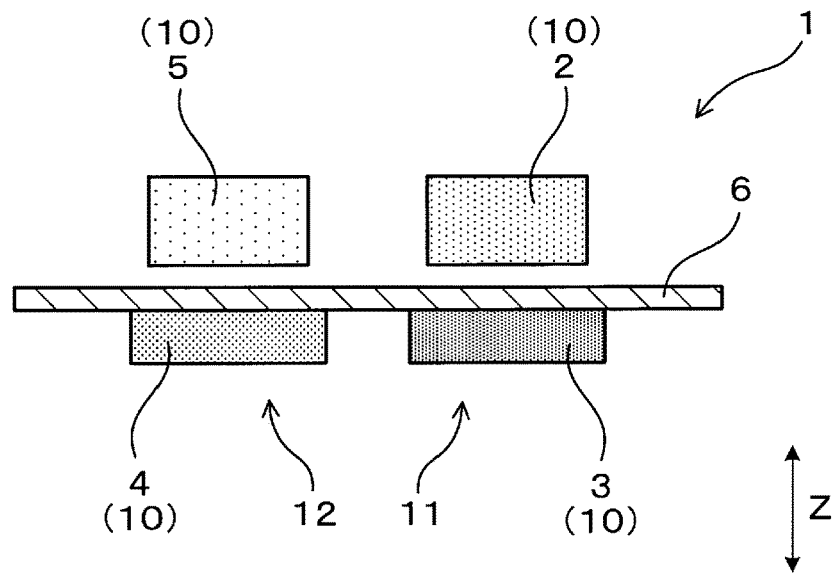
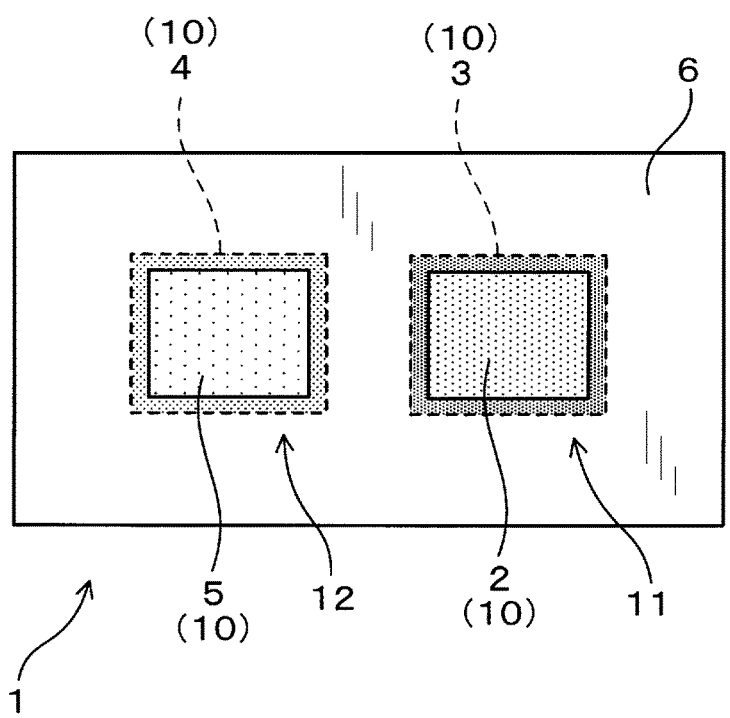

POWER SUPPLY DEVICE

CROSS REFERENCE RELATED APPLICATION

This application claims the benefit of priority of Japanese Patent Application No. 2015-247539 filed on Dec. 18, 2015, the entire contents of which are incorporated herein by reference.

TECHNICAL FIELD

The present disclosure relates to a power supply device.

BACKGROUND ART

Power supply devices such as a DC-DC converter and a charging device provided therewith have been used, for example, in hybrid cars and electric cars. Such power supply devices include a transformer, a choke coil, a primary semiconductor component, and a secondary semiconductor component. Patent Literature 1 discloses a power supply device in which two stacking bodies are formed by stacking the plurality of electronic components respectively into pairs. With this, downsizing and noise reduction of the power supply device are achieved.

CITATION LIST

Patent Literature

[PTL 1] JP 2015-47058 A

SUMMARY

A power supply device in general includes a circuit board on which a control circuit is formed. However, according to the disclosure of Patent Literature 1, a circuit board is arranged at a position which is opposite to semiconductor components of stacking bodies. In other words, the transformer or the choke coil is interposed between the circuit board and the semiconductor components. Therefore, lengths of wires between the circuit board and the semiconductor components are likely to increase. It is thus considered that there is room for further noise reduction.

In addition, the configuration in which the transformer or the choke coil is interposed between the circuit board and the semiconductor components is likely to be disadvantageous in terms of heat dissipation of the transformer or the choke coil.

The present disclosure aims to provide a power supply device which can achieve downsizing thereof, noise reduction, and improvement in heat dissipation efficiency.

According to an aspect of the present disclosure, a power supply device is provided with; a transformer having a primary coil and a secondary coil and cores; a primary semiconductor component which forms a primary circuit, the primary circuit being connected to the primary coil of the transformer; a secondary semiconductor component forming a secondary circuit connected to the secondary coil of the transformer; a choke coil forming the secondary circuit with the secondary semiconductor component, the choke coil including a coil portion and cores; and a circuit board onto which a control circuit is formed.

The transformer, the primary semiconductor component, the secondary semiconductor component and the choke coil are electronic components, which are disposed in a pair, two by two, in order to configure a first stacked body and a second stacked body. One pair of the electronic components which forms the first stacked body and another pair of the electronic components which forms the second stacked body are stacked in a normal direction of the circuit, and the circuit substrate is intervened between the one pair of the electrical components configuring the first stacked body and the other pair of the electrical components configuring the second stacked body.

The power supply device is provided with the first stacked body and the second stacked body each of which is formed from the two electrical components which include, the transformer, the primary semiconductor component, the secondary semiconductor component, and the choke coil. According to the configuration, a disposed space of the electrical components, viewed in the normal direction of the board may be decreased, thus, downsizing of the power supply apparatus also achieved.

In addition, the circuit board is interposed between the electronic components in the pair forming the first stacked body, and between the electronic components in the other pair forming the second stacked body. Therefore, a distance between the circuit board and any of the electronic components can be reduced and lengths of wires between the circuit board and the electronic components may also be reduced. Furthermore, noise which is caused by the connecting wires may also be reduced as a result.

Furthermore, since the plurality of electronic components are dispersed on both sides of the circuit board, and heat from the electronic components is easily dissipated. In other words, heat dissipation efficiency of the power supply device can be enhanced.

As described above, according to the above-described mode a power supply device in which downsizing thereof is achieved, in addition to noise reduction, and an improved heat dissipation efficiency may also be provided.

BRIEF DESCRIPTION OF THE DRAWINGS

The above-described objects, other objects, features, and advantages of the present disclosure become more apparent in light of the following detailed description with reference to the accompanying drawings.

FIG. 1 is a schematic cross-sectional view of a power supply device according to a first embodiment;

FIG. 2 is a schematic plan view of the power supply device according to the first embodiment viewed in a board normal direction;

DESCRIPTION OF EMBODIMENTS

Figure 3:
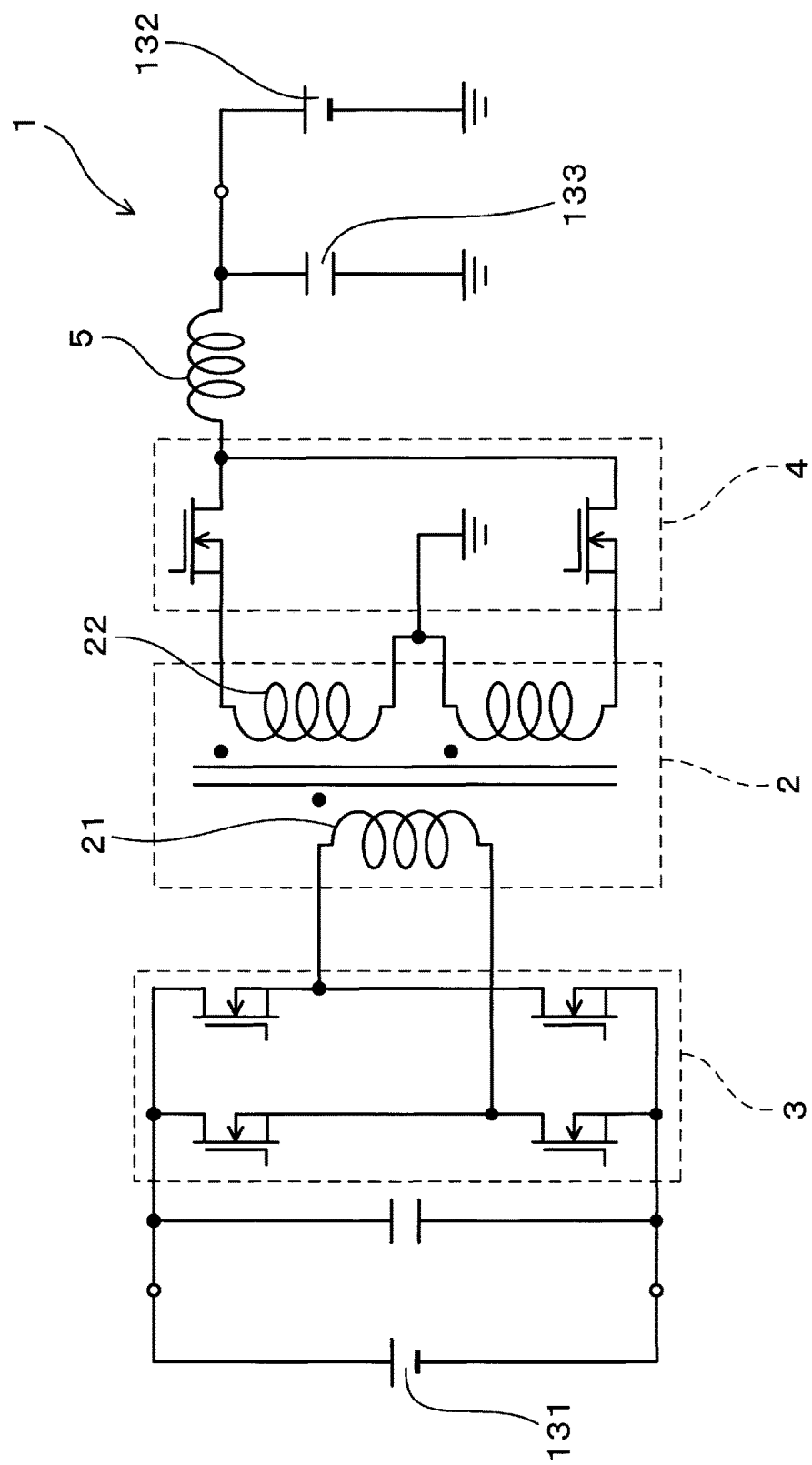
FIG. 3 is a circuit diagram of the power supply device according to the first embodiment.

The power supply device according to a mode described above is applicable, as a DC-DC converter which converts high-voltage DC power from a DC power supply to low-voltage DC power, for example. The power supply device may also be installed, for example, in electric cars and hybrid cars.

The power supply device preferably includes a connecting member that electrically connects a plurality of electronic components to each other, or the plurality of electronic components and the circuit board to each other. Also, the power supply device is preferably provided with the connecting member interposed between the pair of electronic components which form the first stacked body, and also interposed between the electronic components which form another pair forming the second stacked body. In this case, wiring distances between the electronic components or between the electronic components and the circuit board can be reduced, hence further noise reduction and downsizing can be achieved.

The connecting member may include a conductive main body portion, and a plurality of connection terminal portions protruding from the conductive main body portion in a normal direction of the/a board. At least two members among the plurality of electronic components and of the circuit board may be connected to the plurality of connection terminal portions. In this case, assembly workability of the electronic components and the circuit board with respect to the connecting member can be increased.

The first stacked body may be formed of a transformer and either primary semiconductor components or secondary semiconductor components. The second stacked body may be formed of a choke coil and either one of the secondary semiconductor component and the primary semiconductor component. The transformer and the choke coil may be arranged on the same surface side of the circuit board. In this case, the power supply device in the board normal direction is easily downsized.

First Embodiment

Embodiments of a power supply device will now be described with reference to FIGS. 1 to 3.

As illustrated in FIGS. 1 and 2, a power supply device 1 includes a transformer 2, a primary semiconductor component 3, a secondary semiconductor component 4, a choke coil 5, and a circuit board 6.

As shown in FIG. 3, the transformer 2 includes a primary coil 21 and a secondary coil 22. The primary semiconductor component 3 forms a primary circuit which is connected to the primary coil 21 of the transformer 2. The secondary semiconductor component 4 forms a secondary circuit which is connected to the secondary coil 22 of the transformer 2. The choke coil 5 forms the secondary circuit in collaboration with the secondary semiconductor component 4. A control circuit is formed on the circuit board 6.

As shown in FIGS. 1 and 2, pairs of electronic components 10 are stacked in the normal direction Z of the board, each of the pairs forming the respective first stacked body 11 and the second stacked body 12. The pair of electronic components are the electronic components which includes the transformer 2 and the primary semiconductor component 3, and the second semiconductor 4 and the choke coil 5. Each pair of the electronic components is stacked to form the respective first stacked body 11 and the second stacked body 12 in a normal direction Z of the board. It is noted that the normal direction Z of the board specifically relates to a normal direction of the circuit board 6.

The circuit board 6 is interposed between the electronic components 10 which are paired to form the first stacked body 11, and also between the electronic components 10 which are provided as another pair to form the second stacked body 12.

In the present embodiment, the first stacked body 11 is formed of the transformer 2 and the primary semiconductor component 3. The second stacked body 12 is formed of the choke coil 5 and the secondary semiconductor component 4. Furthermore, the transformer 2 and the choke coil 5 are arranged on the same surface side of the circuit board 6. The circuit board 6 is interposed between the transformer 2 and the primary semiconductor component 3, and also between the choke coil 5 and the secondary semiconductor component 4. Hereafter, a side of the circuit board 6 onto which the transformer 2 and the choke coil 5 are arranged is referred to as an upper side, and a side which is opposite thereto is referred to as a lower side. Note that, this expression is used for convenience, and does not limit an orientation of the power supply device 1.

In this example, the power supply device 1 is a DC-DC converter. The DC-DC converter is installed, for example, in electric cars and hybrid cars, and is used to step-down high-voltage DC power from a DC power supply to low-voltage DC power, and also to supply the low-voltage DC power to an auxiliary battery. Specifically, as shown in FIG. 3, the power supply device 1 is connected between a DC primary power supply 131 and a DC secondary power supply 132 (such as the auxiliary battery). Further, the primary circuit formed of the primary semiconductor component 3 is connected to the primary DC power supply 131, and the secondary circuit formed of the secondary semiconductor component 4 is connected to the secondary DC power supply 132 via a ripple filter which includes the choke coil 5.

The primary circuit serves as a switching circuit. The primary semiconductor component 3 is formed of a semiconductor module which has a plurality of built-in switching elements. MOSFETs, IGBTs, or the like may be used as these switching elements. The MOSFET is an abbreviation of Metal-Oxide Semiconductor Field-Effect Transistor. The IGBT is an abbreviation of Insulated-Gate Bipolar Transistor. Note that, the primary semiconductor component are not necessarily the semiconductor module, and may be, for example, a discrete semiconductor component.

The secondary circuit serves as a rectifying circuit, and the secondary semiconductor component 4 is formed of a semiconductor module including a plurality of built-in switching elements. The MOSFETs, the IGBTs, or the like may also be used as these switching elements. Note that, the secondary semiconductor component may be a diode module including a plurality of built-in diodes. Alternatively, the secondary semiconductor component may be a discrete semiconductor component.

The choke coil 5 forms the ripple filter with a capacitor 133. The DC power input to the power supply device 1 according to the present embodiment is converted to AC power in the primary switching circuit, and then input into the transformer 2. After step down of the input AC power at the transformer 2 is performed, the power is then rectified at the secondary rectifying circuit to a DC power. Next, the step-down DC power is smoothed by the ripple filter, and then output.

In contrast, step-up of the DC power from the secondary DC power supply 132 may be performed, and then charged to the primary DC power supply 131.

Although not shown, the control circuit is formed on the circuit board 6. This control circuit is configured to perform ON/OFF control of the switching elements of the primary semiconductor component 3, and the switching elements of the secondary semiconductor component 4. Thus, signaling terminals of each of the switching elements, such as gate terminals of the MOSFETs, are connected to the control circuit on the circuit board 6.

In the present embodiment, the primary semiconductor component 3 and the secondary semiconductor component 4 are mounted directly onto the circuit board 6. Specifically, the semiconductor modules being the primary semiconductor component 3 and the secondary semiconductor component 4 include lead terminals (not shown). These lead terminals are connected directly to the circuit board 6. Note that, the lead terminals may be signal terminals connected, for example, to the gates of the switching elements. Alternatively, the lead terminals which are connected to sources and the like or drains and the like of the switching elements may be connected directly to the circuit board 6.

Note that, the above-mentioned "sources and the like" refer to sources in the case where the switching elements are the MOSFETs, and emitters in the case where the switching elements are the IGBTs. Similarly, the above-mentioned "drains and the like" refer not only to drains in the case where the switching elements are the MOSFETs, but also to collectors in the case where the switching elements are the IGBTs. The same applies to the following.

Next, functions and advantages of the present embodiment are described.

In the above-described power supply device 1, the transformer 2 and the primary semiconductor component 3 form the first stacked body 11, and the secondary semiconductor component 4 and the choke coil 5 form the second stacked body 12. Due to this, the electronic components 10 may be easily arranged in a more compact space when viewed in the normal direction Z of the board. Therefore, downsizing of the power supply device 1 can be achieved.

In addition, the circuit board 6 is interposed between the electronic components 10 in the pair forming the first stacked body 11, and between the electronic components 10 in the other pair forming the second stacked body 12. Therefore, a distances between the circuit board 6 and any of the electronic components 10 can be reduced. As a result, lengths of wires between the circuit board 6 and the electronic components 10 can be reduced. Accordingly, noise caused by the connecting wires can be reduced.

In particular, since the distance between the circuit board 6 and both the primary semiconductor component 3 and the secondary semiconductor component 4 can be reduced, and the wiring distances between the control circuit and the gates of the switching elements can also be reduced. As a result, noise caused by control signal current, and noise which influences the control signal current can be reduced.

Furthermore, since the plurality of electronic components 10 are dispersed on both sides of the circuit board 6, heat from the electronic components 10 is easily dissipated. In other words, heat dissipation efficiency of the power supply device 1 can be increased. In addition, although not shown in the figures, cooling members may be provided such that the first stacked body 11 and the second stacked body 12 are in contact with the cooling members on both sides in the normal direction Z of the board. According to the configuration the heat dissipation efficiency can be further increased and noise can be further decreased as a result.

Furthermore, since the primary semiconductor component 3 and the secondary semiconductor component 4 are mounted directly to the circuit board 6, and an assembly thereof can be enhanced. In addition, the noise can be further reduced.

As described above, according the present embodiment, a power supply device in which downsizing and noise reduction is achieved can be provided.

Second Embodiment

Figure 4:
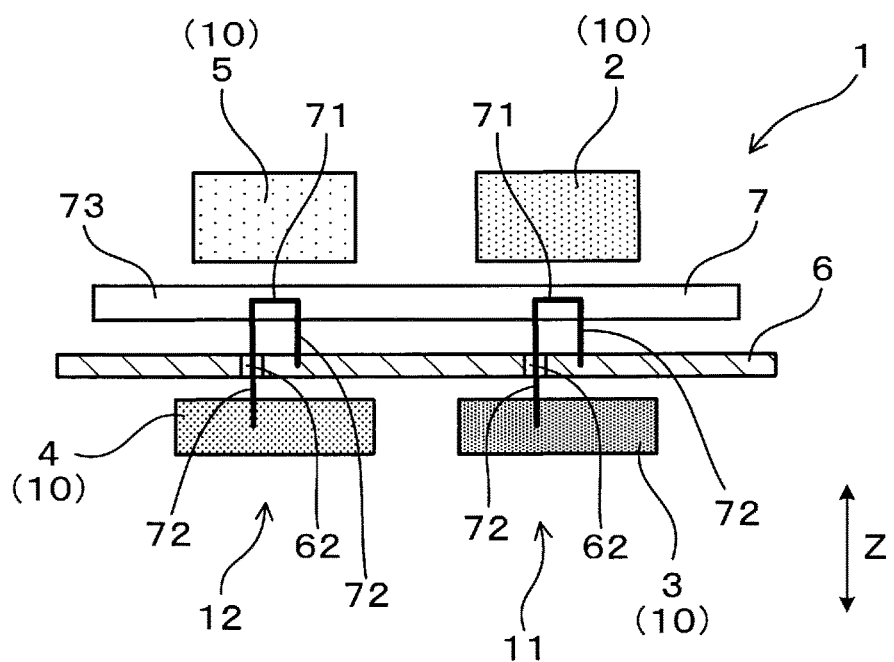
FIG. 4 is a schematic cross-sectional view of a power supply device according to a second embodiment.
Figure 5:
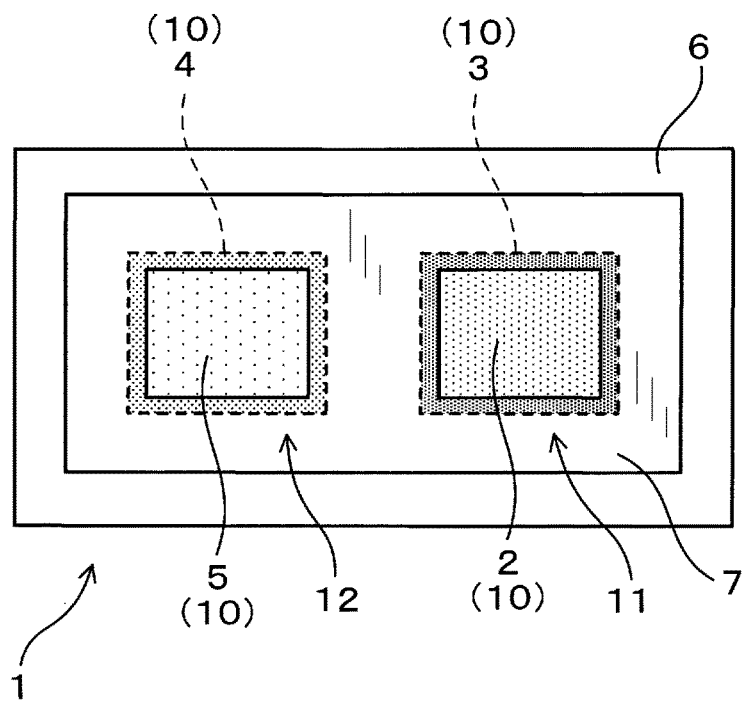
FIG. 5 is a schematic plan view of the power supply device according to the second embodiment viewed in the board normal direction.

As illustrated in FIGS. 4 and 5, the power supply device 1 according to a second embodiment further includes a connecting member 7.

The connecting member 7 electrically connects the plurality of electronic components 10 to each other, or the electronic components 10 and the circuit board 6 to each other. The connecting member 7 is provided between the pair of the electronic components 10 which forms the first stacked body 11, and between the other pair of the electronic components 10 which forms the second stacked body 12. In the present embodiment, the connecting member 7 is interposed between the transformer 2 and the primary semiconductor component 3, and between the choke coil 5 and the secondary semiconductor component 4. In addition, the connecting member 7 is arranged on the upper-side of the circuit board 6. Note that, the connecting member 7 may also be arranged on the lower-side of the circuit board 6.

The connecting member 7 includes conductive body portions 71 and a plurality of connection terminal portions 72. The connection terminal portions 72 are disposed to extend from the conductive body portions 71 in the normal direction Z of the board. At least two members among the plurality of electronic components 10 and of the circuit board 6 are connected to the connection terminal portions 72.

At least one of the primary semiconductor component 3 and the secondary semiconductor component 4, and the circuit board 6 is electrically connected to each other via the connection terminal portions 72 and the conductive body portions 71. In the present embodiment, both the primary semiconductor component 3 and the secondary semiconductor component 4 are connected to the circuit board 6 via the connection terminal portions 72 and the conductive body portions 71 of the connecting member 7.

The connection terminal portions 72 which are connected to the primary semiconductor component 3 or the secondary semiconductor component 4 may be connected to the gates of the switching elements for example. In this case, the connection terminal portions 72 which are electrically connected to the connection terminal portions 72 are connected to the control circuit on the circuit board 6. Alternatively, the connection terminal portions 72 which are connected to the primary semiconductor component 3 or the secondary semiconductor component 4 may be connected, to sources of switching elements, for example, or power terminals of drains for example.

The connecting member 7 includes a sealing portion 73 which is formed by sealing at least a part of the conductive body portions 71 with a resin. The connection terminal portions 72 are exposed from the sealing portion 73. The plurality of connection terminal portions 72 each extend to the lower side in normal direction Z of the board. Furthermore, those connection terminal portions 72 are connected respectively to each of the circuit board 6, the primary semiconductor component 3, and the secondary semiconductor component 4. Note that, the connection terminal portions 72 of the connecting member 7 may extend to the upper side.

The circuit board 6 has through-holes 62 which are formed to as holes passing through in the normal direction Z of the board. The connection terminal portion 72 which is connected to each of the primary semiconductor component 3 and the secondary semiconductor component 4 is inserted through the through hole 62. Other configuring features are the same as those described in the first embodiment. Note that, reference symbols in embodiments following the second embodiment that are the same as the reference symbols used in preceding embodiments, specifically first and second embodiments, unless stated otherwise represent the same components and the like.

The power supply device 1 according to the present embodiment includes the connecting member 7. Furthermore, the connecting member 7 is interposed between the pair of the electronic components 10 forming the first stacked body 11, and between the other pair of the electronic components 10 forming the second stacked body 12. Therefore, the distance of wires between the electronic components 10 and the circuit board 6 can be reduced, and further noise reduction and downsizing can thus be achieved.

The connecting member 7 includes the conductive body portions 71 and the connection terminal portions 72. As a result, an assembling efficiency of the electronic components 10 and the circuit board 6 to the connecting member 7 can be increased. Specifically, when assembling the connecting member 7, the electronic components 10, and the circuit board 6 to each other, these components may be moved relative to each other in the normal direction Z of the board, without being moved in a direction parallel to the circuit board 6. Thus, area required to assemble configuring components can be reduced.

Other effects and advantages of the second embodiment are the same as the first embodiment.

Third Embodiment

According to a third embodiment, at least one of the transformer 2 and the choke coil 5, is electrically connected to the circuit board 6 via the connection terminal portions 72 and the conductive body portions 71.

More specifically, both the transformer 2 and the choke coil 5, and the circuit board 6 are electrically connected to each other via the connection terminal portions 72 and the conductive body portions 71 of the connecting member 7.

Figure 7:
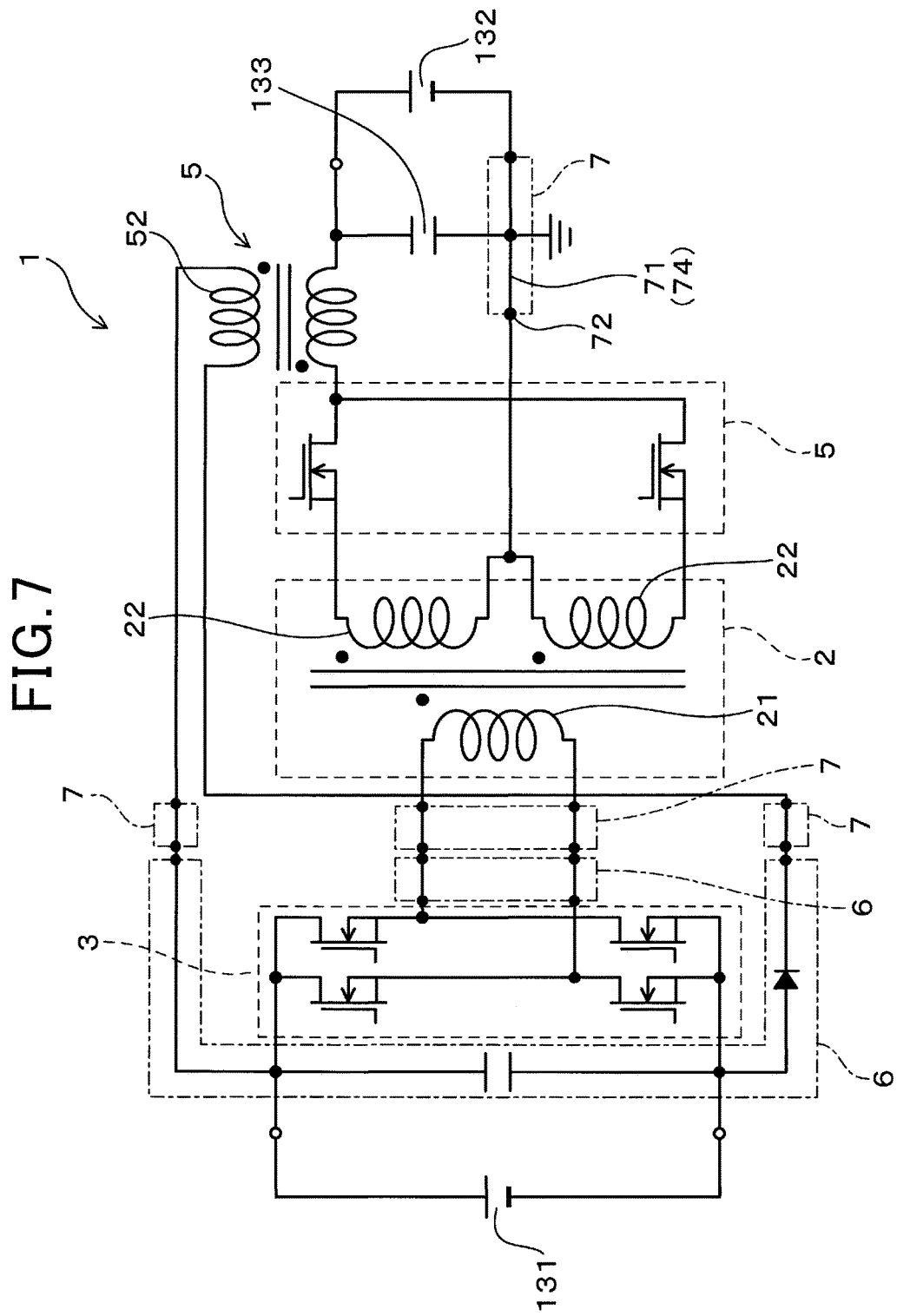
FIG. 7 is a circuit diagram of the power supply device according to the third embodiment.

As shown in the circuit diagram of FIG. 7, a pair of terminals of the primary coil 21 of the transformer 2 are connected to the circuit board 6 via the connecting member 7. In addition, the primary semiconductor component 3 which is mounted onto the circuit board 6 is connected to conductive wires formed on the circuit board 6. Therefore, the primary coil 21 is electrically connected to the primary semiconductor component 3 via the connecting member 7 and the circuit board 6.

Specifically, the conductive wires formed on the circuit board 6 are independent of the control circuit, and the primary coil 21 is connected to the primary semiconductor component 3 via the conductive wires. In addition, a pair of terminals of the primary coil 21 are electrically connected to wires which are provided between the switching elements on respective high side and the switching elements on a respective low side of the primary semiconductor component 3.

Furthermore, the connecting member 7 allows a pair of terminals of an auxiliary coil 52 of the choke coil 5 to be connected to the circuit board 6. The auxiliary coil 52 is used to step-up the voltage of the secondary DC power supply 132 and to supply the power to the primary DC power supply 131. In this case, energy which is accumulated in the choke coil 5 is energy which is supplied to the primary circuit. A diode for preventing a reversed current flow is provided between one of the terminals of the auxiliary coil 52 and the primary circuit.

Figure 6:
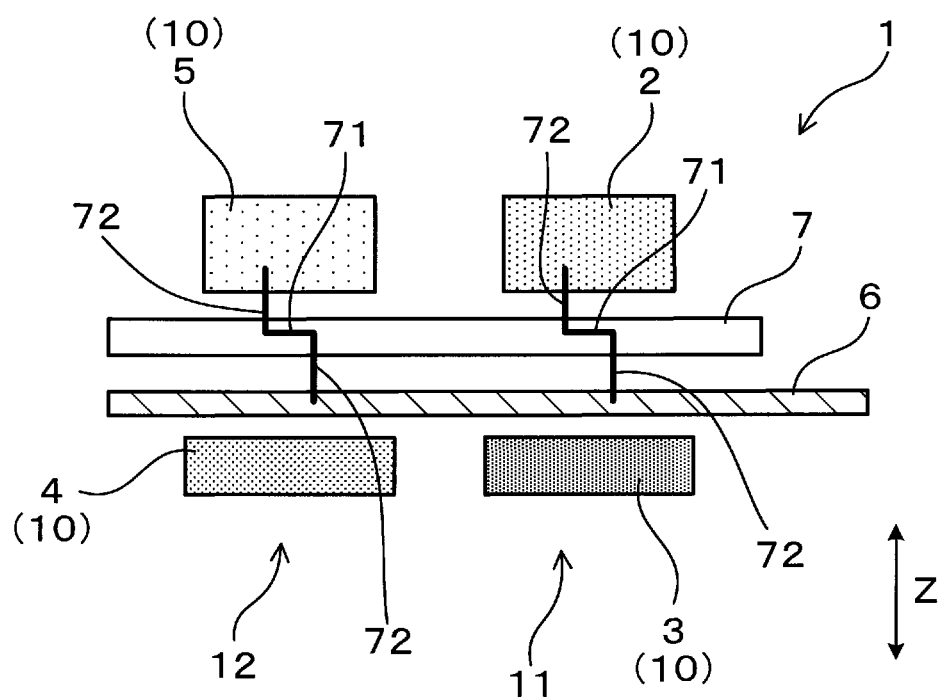
FIG. 6 is a schematic cross-sectional view of a power supply device according to a third embodiment.
Figure 8:
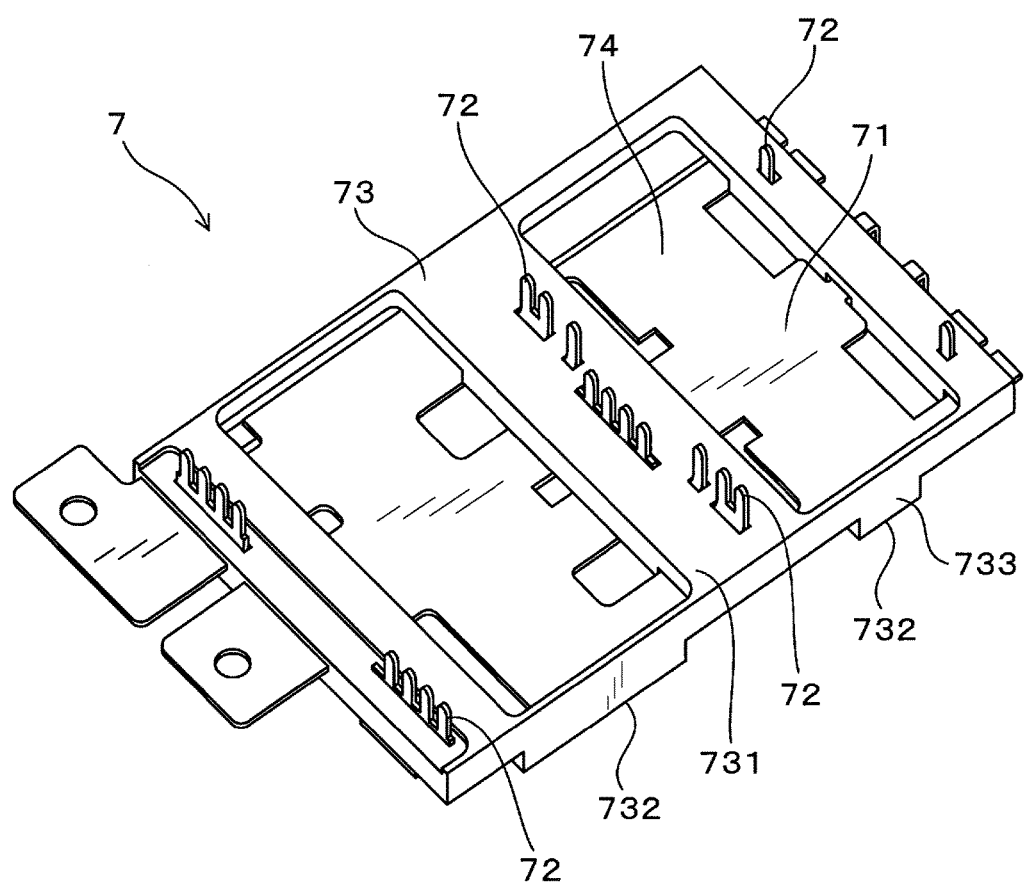
FIG. 8 is a perspective view of a connecting member according to the third embodiment viewed from obliquely above.
Figure 9:
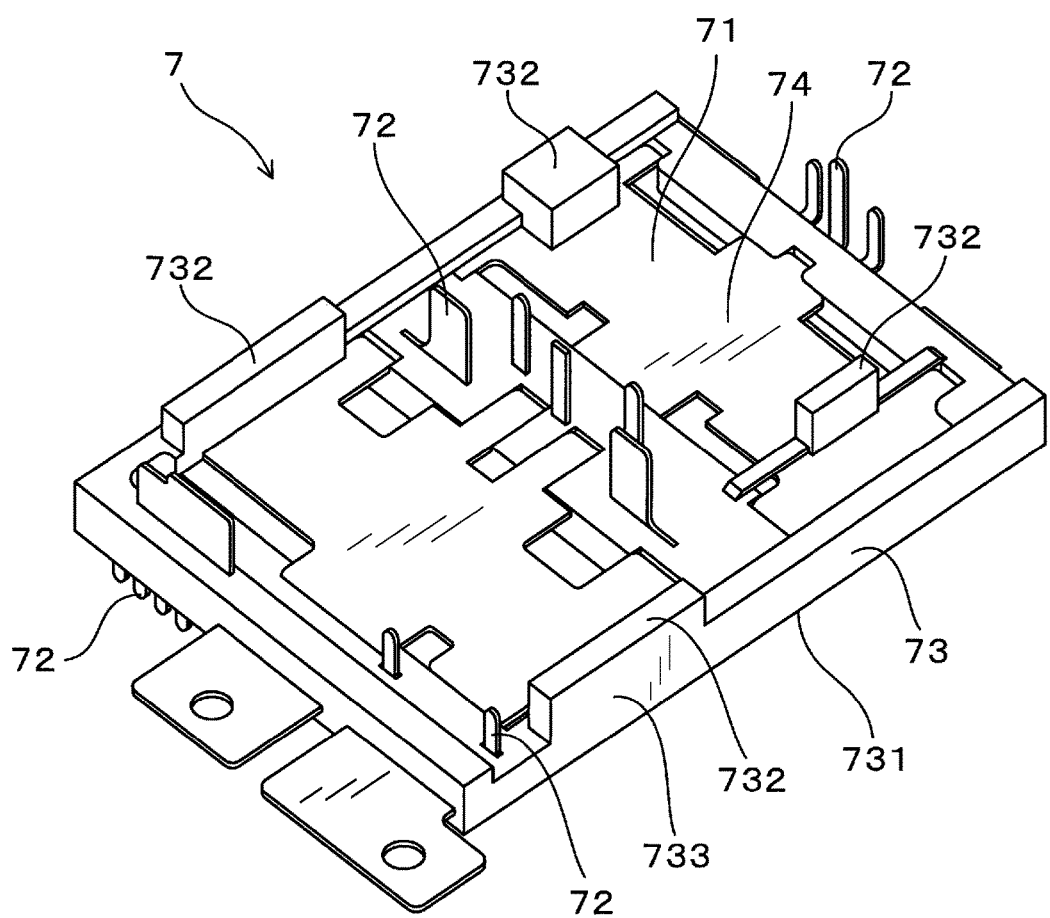
FIG. 9 is a perspective view of the connecting member according to the third embodiment viewed from obliquely below.
Figure 10:
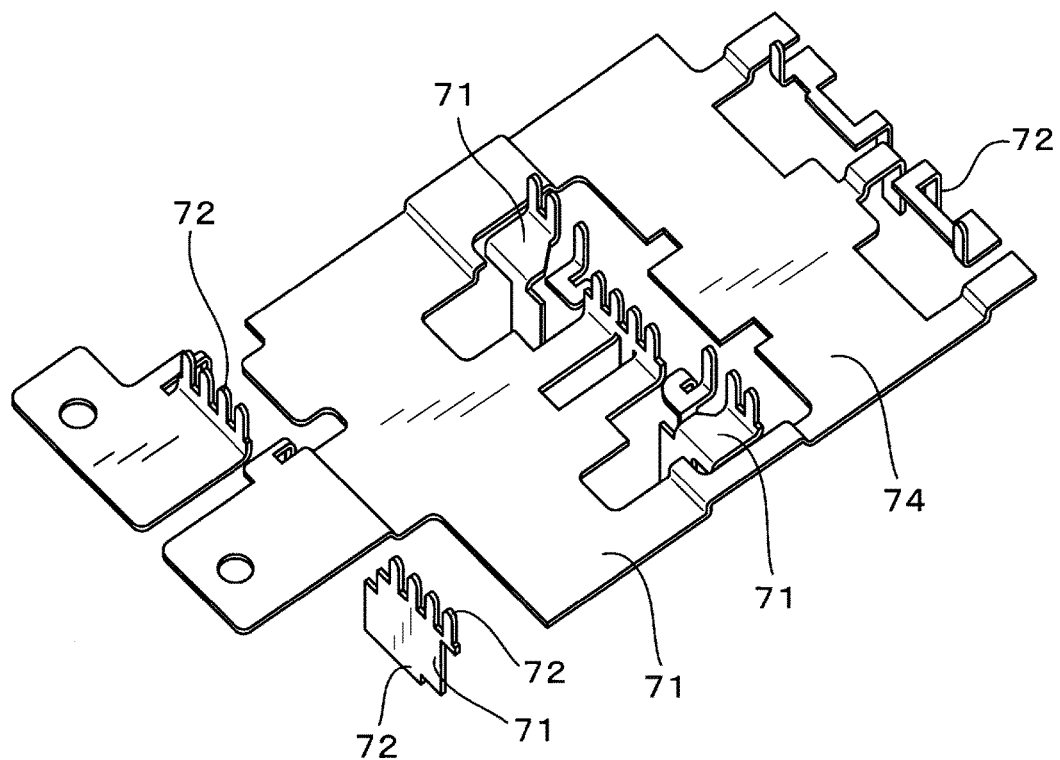
FIG. 10 is a perspective view of conductive body portions and connection terminal portions according to the third embodiment viewed from obliquely above.

As illustrated in FIGS. 8 and 9, the connecting member 7 includes the sealing portion 73 which is formed by sealing at least the one part of the conductive body portions 71 with a resin. The connection terminal portions 72 are exposed from the sealing portion 73. The plurality of connection terminal portions 72 are provided to extend on both an upper side and a lower side of the connecting member 7 in the normal direction Z of the board. Furthermore, as illustrated in FIG. 6, the connection terminal portions 72, which protrude to the upper side, are connected to the transformer 2 and the choke coil 5. The connection terminal portions 72, which protrude to the lower side are connected to the circuit board 6. Additionally, the connection terminal portions 72 which are connected to the transformer 2, and the connection terminal portions 72 which are connected to the choke coil 5 are electrically independent of each other. In other words, as illustrated in FIGS. 6 and 10, the plurality of conductive body portions 71 of the connecting member 7 are electrically independent from each other.

Figure 11:
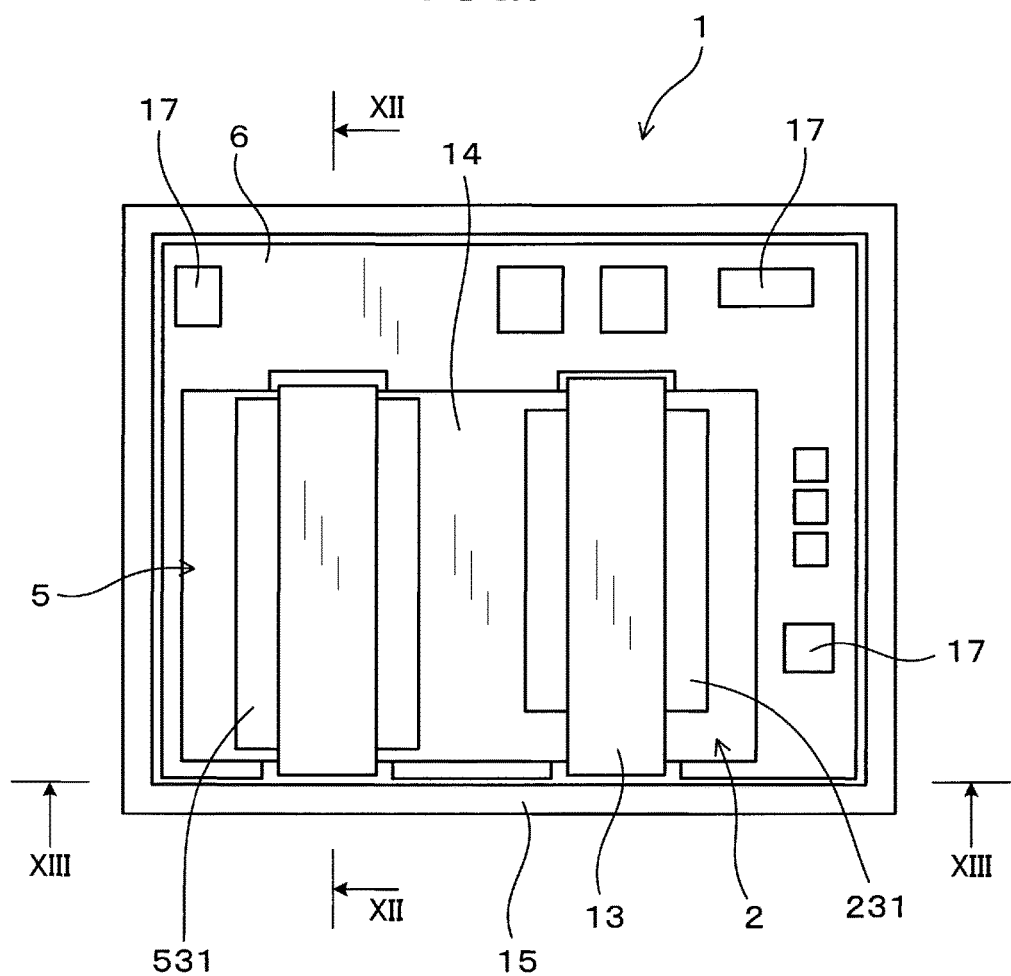
FIG. 11 is an explanatory plan view of the power supply device viewed in the board normal direction according to the third embodiment.
Figure 12:
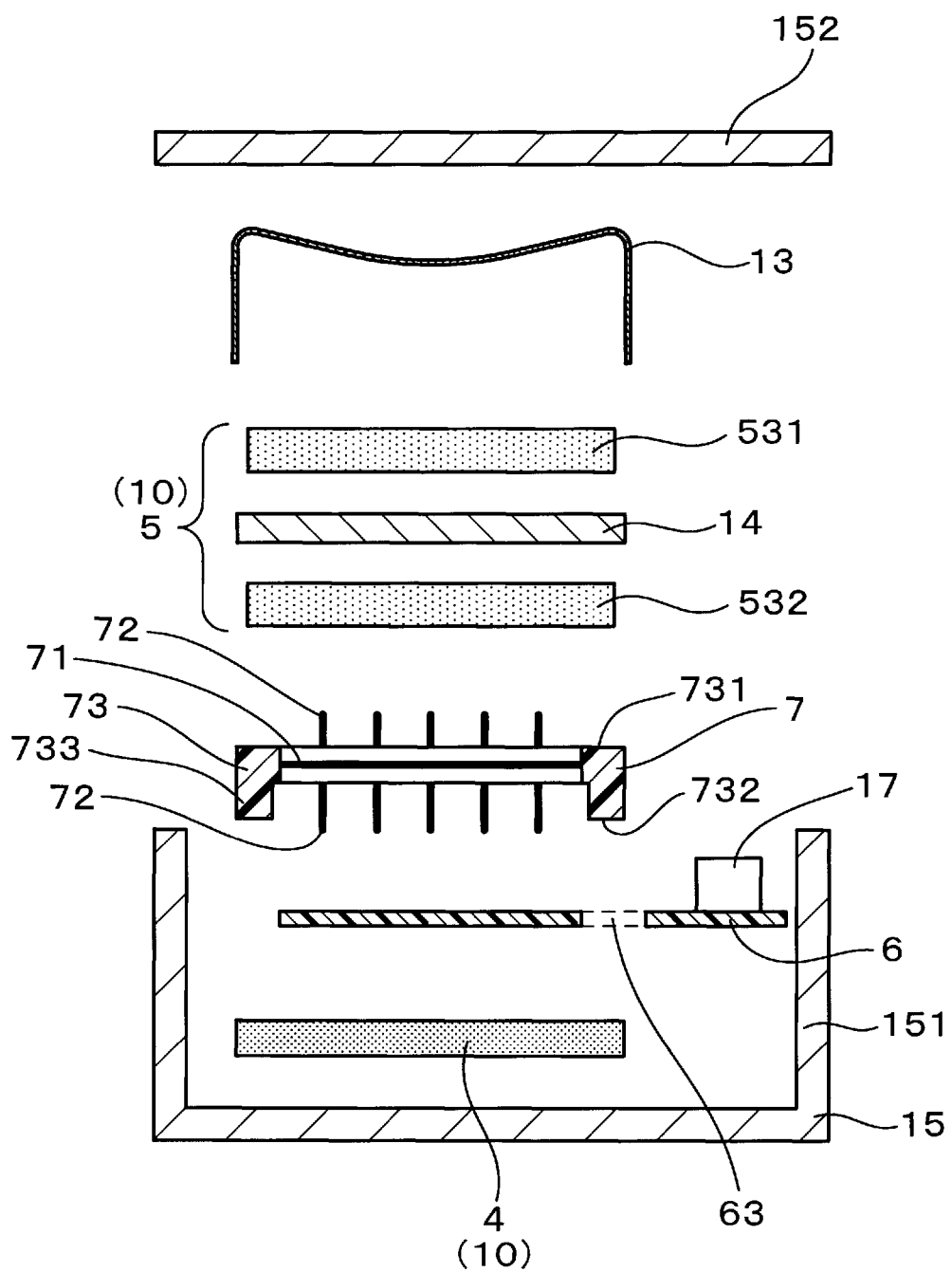
FIG. 12 is an exploded view descriptively showing a cross-sectional across arrows XII-XII in FIG. 11 according to the third embodiment.
Figure 13:
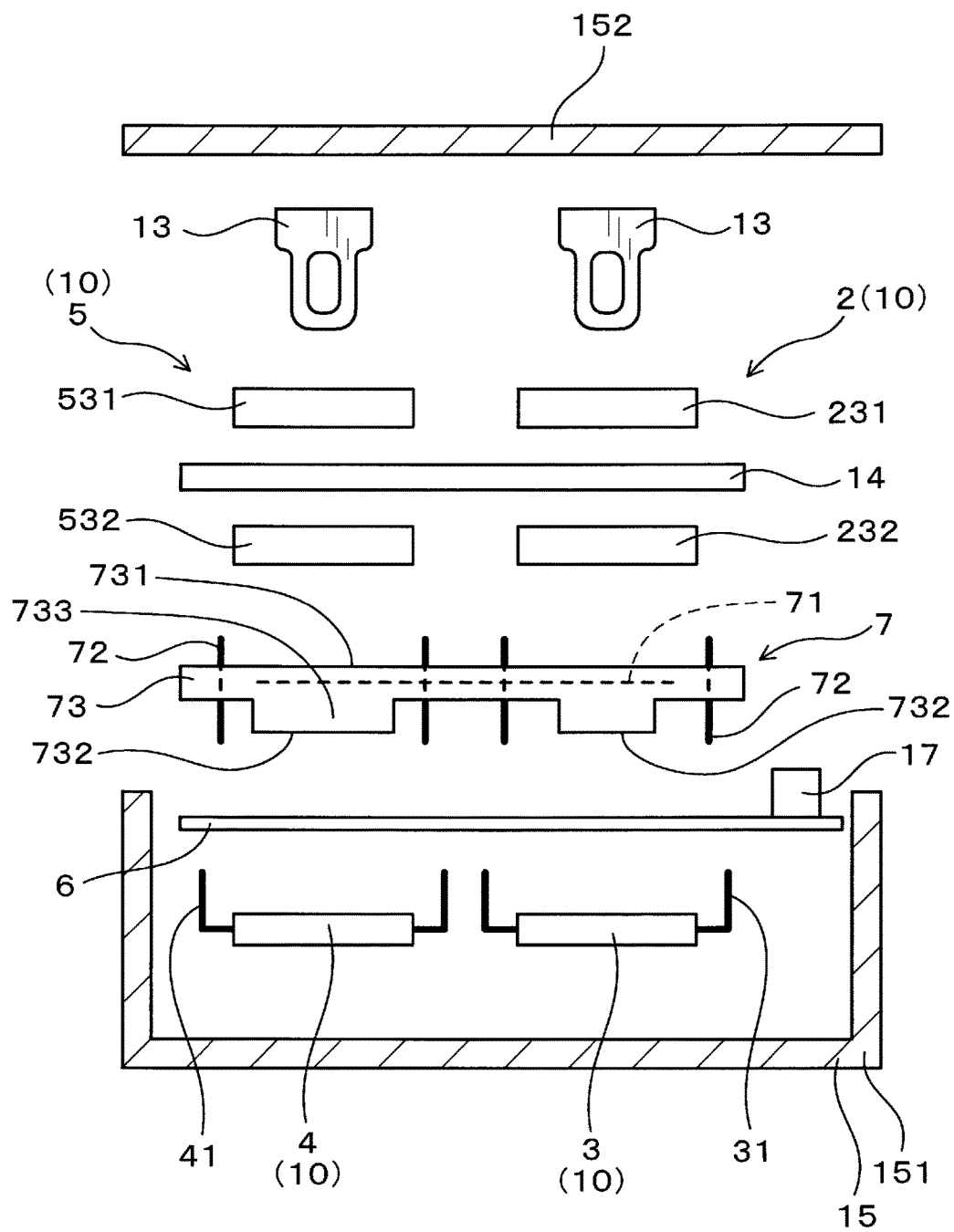
FIG. 13 is an exploded view descriptively showing a cross-sectional view across arrows XIII-XIII in FIG. 11 according to the third embodiment.

As illustrated in FIGS. 11 to 13, the transformer 2 or the choke coil 5 includes a printed circuit board 14 onto which at least one part of a coil portion is formed. In the present embodiment, the transformer 2 and the choke coil 5 include a thick copper board as the printed circuit board 14.

The primary coil 21 and the secondary coils 22 of the transformer 2, and the coil portion of the choke coil 5 are configured to share the single printed circuit board 14. Although not shown in the figures, the printed circuit board 14 is provided with a plurality of conductive layers and a resin layer. Furthermore, in the present embodiment, the plurality of conductive layers are formed at both a first part and a second part of two parts in an expanding direction of the printed circuit board 14. Specifically, the first part of the printed circuit board 14, and an upper core 231 and a lower core 232 which are respectively arranged to sandwich the first part configure the transformer 2. In addition, the second part of the printed circuit board 14, and an upper core 531 and a lower core 532 which are respectively arranged to sandwich the second part configure the choke coil 5.

Further, elastic members 13 are arranged respectively on a top surface of the upper core 231 of the transformer 2 and a top surface of the upper core 531 of the choke coil 5. In addition, the connecting member 7 is arranged below the lower core 232 of the transformer 2 and the lower core 532 of the choke coil 5.

As illustrated in FIGS. 12 and 13, the sealing portion 73 of the connecting member 7 is supported on both the sides by the pair of the electronic components 10 forming the first stacked body 11, and the other pair of the electronic components 10 forming the second stacked body 12 in the normal direction Z of the board. In the present embodiment, the sealing portion 73 is supported not only by the transformer 2 and the primary semiconductor component 3 but also by the choke coil 5 and the secondary semiconductor component 4.

The sealing portion 73 has an upper abutting surface 731 that abuts against the electronic components 10 on the upper side, and a lower abutting surface 732 that makes contact with the electronic components 10 on the lower side. In the present embodiment, the upper abutting surface 731 makes contact with the lower core 232 of the transformer 2 and the lower core 532 of the choke coil 5. In addition, the lower abutting surface 732 is in contact with the primary semiconductor component 3 and the secondary semiconductor component 4. The respective upper abutting surface 731 and the lower abutting surface 732 are flat surfaces orthogonal to the normal direction Z of the board. The sealing portion 73 includes leg portions 733 which have the lower abutting surface 732 as their bottom surface. Note that, an opening portion 63 which is provided to avoid interference with the leg portion 733 may be formed on the circuit board 6.

The power supply device 1 is provided with configuring components which includes the first stacked body 11 and the second stacked body 12, accommodated inside a casing 15. The casing 15 is formed by combining a lower casing body 151 and an upper casing body 152 to each other.

The primary semiconductor component 3 and the secondary semiconductor component 4, the circuit board 6, the connecting member 7, and the transformer 2 and the choke coil 5 are laminated in this respective order on the lower casing body 151. The elastic members 13 are also arranged on a top side of the respective transformer 2 and the choke coil 5, and the upper casing body 152 is arranged on a top of the elastic members 13. The upper casing body 152 is assembled with the lower casing body 151, and in this state, the elastic members 13 are elastically compressed in the normal direction Z of the board. In this configuration, the elastic members 13 press the first stacked body 11 and the second stacked body 12. At this point, a pressing force of one of the elastic members 13 is applied to the respective transformer 2, the sealing portion 73 of the connecting member 7, and the primary semiconductor component 3 of the first stacked body 11. Furthermore, a pressing force from another elastic member 13 is applied to the respective choke coil 5, the sealing portion 73 of the connecting member 7, and the secondary semiconductor component 4 of the second stacked body 12. In other words, in this configuration, the pressing force is not applied to the circuit board 6.

Figure 14:
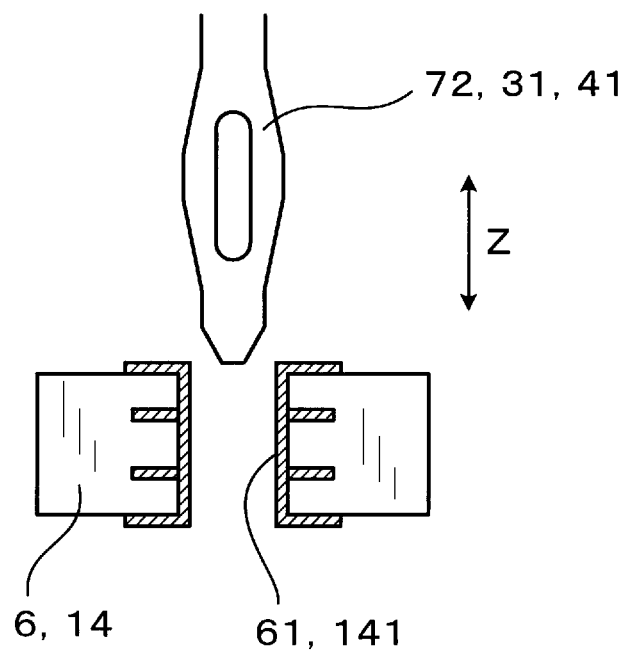
FIG. 14 is an explanatory view of a state of a connection terminal portion or a lead terminal before insertion through a through-hole according to the third embodiment.
Figure 15:
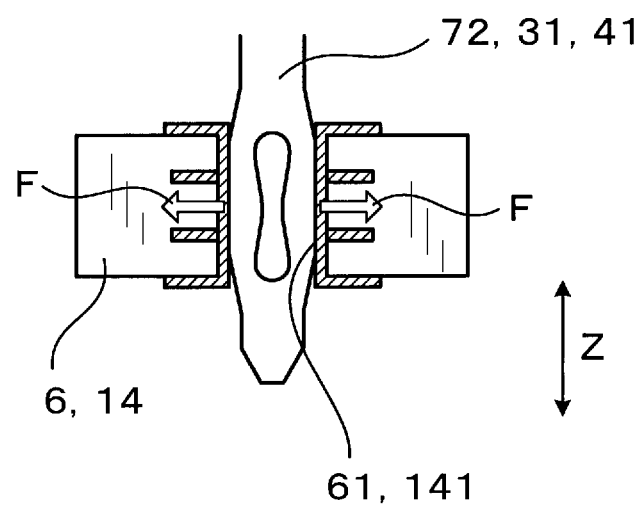
FIG. 15 is an explanatory view of a state of a connection terminal portion or a lead terminal after the insertion through a through-hole according to the third embodiment.

As illustrated in FIGS. 14 and 15, a connection between the connecting member 7 and the circuit board 6 is configured by a through-hole 61 formed on the circuit board 6, and the connection terminal portion 72 inserted into the through-hole 61. The connection terminal portion 72 has a press-fitting structure that is deformable in a radial direction.

Furthermore, the connection terminal portion 72 is press welded to an inner wall surface of the through-hole 61. Specifically, as illustrated in FIG. 14, the connection terminal portion 72 which is inserted into the through-hole 61 has a greater radial direction on at least one side thereof than an inner radius of the through-hole 61. Additionally, the connection terminal portion 72 has deformable elasto-plasticity in the radial direction. As a result, when the connection terminal portion 72 is inserted into the through-hole 61, the connection terminal portion 72 is deformed to be compressed in the radial direction, as shown in FIG. 15. Then, in a state in which the connection terminal portion 72 is arranged in the through-hole 61, a restoring force F acts to an outward-side thereof in the radial direction. In other words, the connection terminal portion 72 is press-welded with the inner wall surface of the through-hole 61.

Note that, the connection terminal portion 72 may be arranged in the through-hole 61 with only an elastic range thereof deformed. Alternatively, when the restoring force F is sufficient, the connection terminal portion 72 may be deformed beyond the elastic deformation range to a plastic deformation range to be arranged in the through hole 61.

The connection between the connecting member 7 and the transformer 2 or the choke coil 5 is provided by a through-hole 141 formed on the printed circuit board 14, and by insertion of the connection terminal portion 72 into the through-hole 141. In the present embodiment, the connection between the transformer 2 and the connecting member 7, and the connection between the choke coil 5 and the connecting member 7 are each provided by the through-hole 141 and the connection terminal portion 72. In addition, these connections are also provided in a state in which the connection terminal portion 72 having the press-fitting structure is press welded to an inner wall surface of the through-hole 141.

Further, the lead terminals of the at least one of the primary semiconductor component 3 and the secondary semiconductor component 4 are inserted into the through-hole 61 formed through the circuit board 6. In the present embodiment, a lead terminal 31 of the primary semiconductor component 3 and a lead terminal 41 of the secondary semiconductor component 4 are each inserted into the through-hole 61. In addition, these connections are also established under the state in which the lead-out terminals 31 and 41 each having the press-fitting structure are each held in press-contact with the inner wall surface of the through-hole 61.

Further, as shown in FIGS. 7 to 10, the connecting member 7 includes a ground bus bar 74 to be grounded. In the present embodiment, the conductive body portion 71 that is conducted to the connection terminal portion 72 to be connected to a center pad between the secondary coils 22 of the transformer 2 serves as the ground bus bar 74. The ground bus bar 74 is arranged to expand between the electronic components 10 in the pair forming the first stacked body 11, and between the electronic components 10 in the other pair forming the second stacked body 12.

Further, as illustrated in FIG. 11, mounting components 17 different from the electronic components 10 are mounted to the circuit board 6. As viewed in the board normal direction Z, the mounting components 17 are arranged at positions that do not overlap with any of the electronic components 10 and the connecting member 7. Examples of the mounting components 17 include a fuse, a capacitor, an input-terminal fitting, a current transformer, a signal connector, and a magnetic component for an auxiliary component. Note that, a height dimension in the board normal direction Z of each of the mounting components 17 is larger than, for example, the clearance between the circuit board 6 and the primary semiconductor component 3 or the secondary semiconductor component 4. Alternatively, the height dimension of each of the mounting components 17 may be larger than, for example, the clearance between the circuit board 6 and the transformer 2 or the choke coil 5.

Other configuration features are the same as those of the first embodiment.

Next, functions and advantages of the present embodiment are described.

In the present embodiment, the pair of the transformer 2 and the choke coil 5 and the circuit board 6 can be connected to each other via the connecting member 7. Thus, electrical connections of the transformer 2 and the choke coil 5 to, for example, other ones of the electronic components 10 can be easily configured. In addition, the connecting wires therebetween can be shortened, and noise reduction can be achieved.

Further, as viewed in the board normal direction Z, the mounting components 17 are arranged at the positions that do not overlap with any of the electronic components 10 and the connecting member 7. With this, the power supply device 1 can be downsized in the board normal direction Z.

In addition, the connection terminal portions 72 and the lead-out terminals 31 and 41 are inserted through the through-holes 61 of the circuit board 6, or the through-holes 141 of the printed circuit board 14. In this configuration, the electronic components 10, the circuit board 6, and the connecting member 7 can be easily assembled to each other in the normal direction Z of the board. Furthermore, the connection terminal portions 72 and the lead terminals 31 and 41 each have the press-fitting structure, therefore the man-hours used for assembly can be further decreased. For example, once the electronic components 10, the connecting member 7, and the circuit board 6 are alignment and set with in the normal direction Z of the board, connections of all the connection terminal portions 72 and the lead terminals 31 and 41 can be accomplished by pressing only once.

Further, by providing the connection terminal portions 72 and the lead terminals 31 and 41 with the press-fitting structure, distances between the terminals can be reduced and distances between the terminals and peripheral components may also be reduced, compared to when soldering connectors are used. Specifically, when the soldering connectors are used, connecting portions are likely to increase in area, for example, by an area of solder fillet. Furthermore, positions of the soldered portions need to be set, for example, such that a large stress is not applied on the on the circuit board 6, in order to prevent cracks on soldered sections. In contrast, when the press-fitting structure is employed, saving space is easily achieved. In addition, in comparison, for example, with welding, the power supply device 1 is easily downsized in terms of, for example, the equipment to be used at the time of the assembly.

Further, the connecting member 7 includes the ground bus bar 74. Thus, influence of electromagnetic noise can be decreased between the electronic components 10 on an upper side of the connecting member 7 and the electronic components 10 on a lower side of the connecting member 7. In addition, since the ground bus bar 74 is arranged between the circuit board 6 and the transformer 2 and the choke coil 5, the influence of electromagnetic noise and influence of heat from the transformer 2 and the choke coil 5 to the circuit board 6 can be effectively reduced.

The sealing portion 73 of the connecting member 7 is supported from both the sides in the normal direction Z of the board by the electronic components 10. As a result, the pressing force is not applied to the circuit board 6, and at the same time, the first stacked body 11 and the second stacked body 12 can be fixed in the normal direction Z of the board. In addition, since these pressing force from the elastic members 13 is not applied to the circuit board 6, the pressing force thereof can be increased and thus vibration resistance can be easily enhanced.

Other effects if the third embodiment are the same as the first embodiment.

Fourth Embodiment

Figure 16:
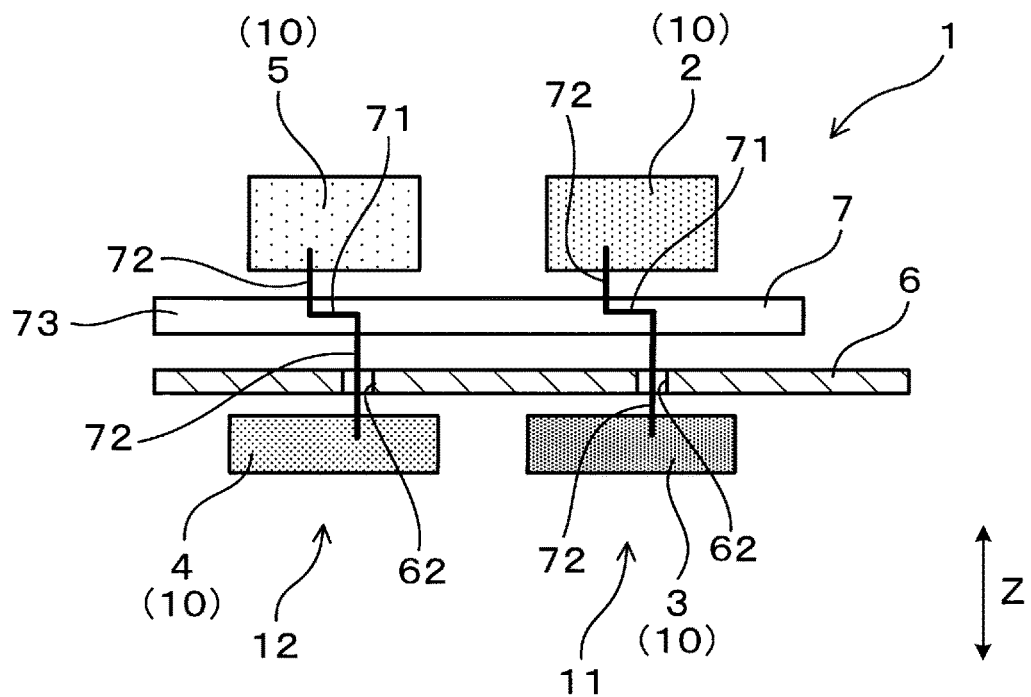
FIG. 16 is a schematic cross-sectional view of a power supply device according to a fourth embodiment.

According to the present embodiment, the plurality of electronic components 10, are arranged to connect to each other via the connecting member 7. Specifically, the plurality of electronic components 10 are provided with the circuit board 6 intervened therebetween the pairs, so that the pairs are on opposed sides, from each other, of the circuit board as shown in FIG. 16.

Specifically, an electrical connection between at least one of a pair of the transformer 2 and the primary semiconductor component 3, a pair of the transformer 2 and the secondary semiconductor component 4, a pair of the choke coil 5 and the secondary semiconductor component 4, and a pair of the choke coil 5 and the primary semiconductor component 3, respectively is provided via the connection terminal portions 72 and the conductive body portions 71. In particular, in the present embodiment, the respective pairs of the transformer 2 and the primary semiconductor component 3, and the choke coil 5 and the secondary semiconductor component 4 are each electrically connected to each other via the connection terminal portions 72 and the conductive body portion 71 of the connecting member 7.

The through-holes 62 are formed on one part of the circuit board 6. Furthermore, the connection terminal portion 72 which is connected to the primary semiconductor component 3, and the connection terminal portion 72 which is connected to the secondary semiconductor component 4 are each inserted through the through-hole 62.

Other configuration features are the same as the first embodiment. Also according to the present embodiment, a power supply device which can achieve downsizing, noise reduction, and improvement in heat dissipation efficiency can be obtained.

Fifth Embodiment

Figure 17:
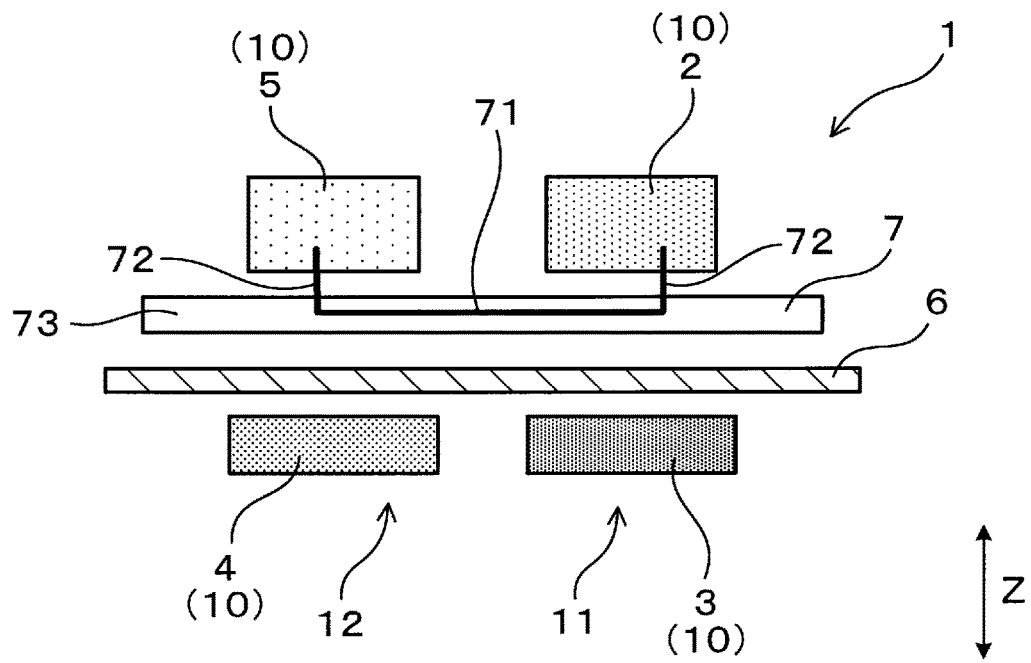
FIG. 17 is a schematic cross-sectional view of a power supply device according to a fifth embodiment.
Figure 18:
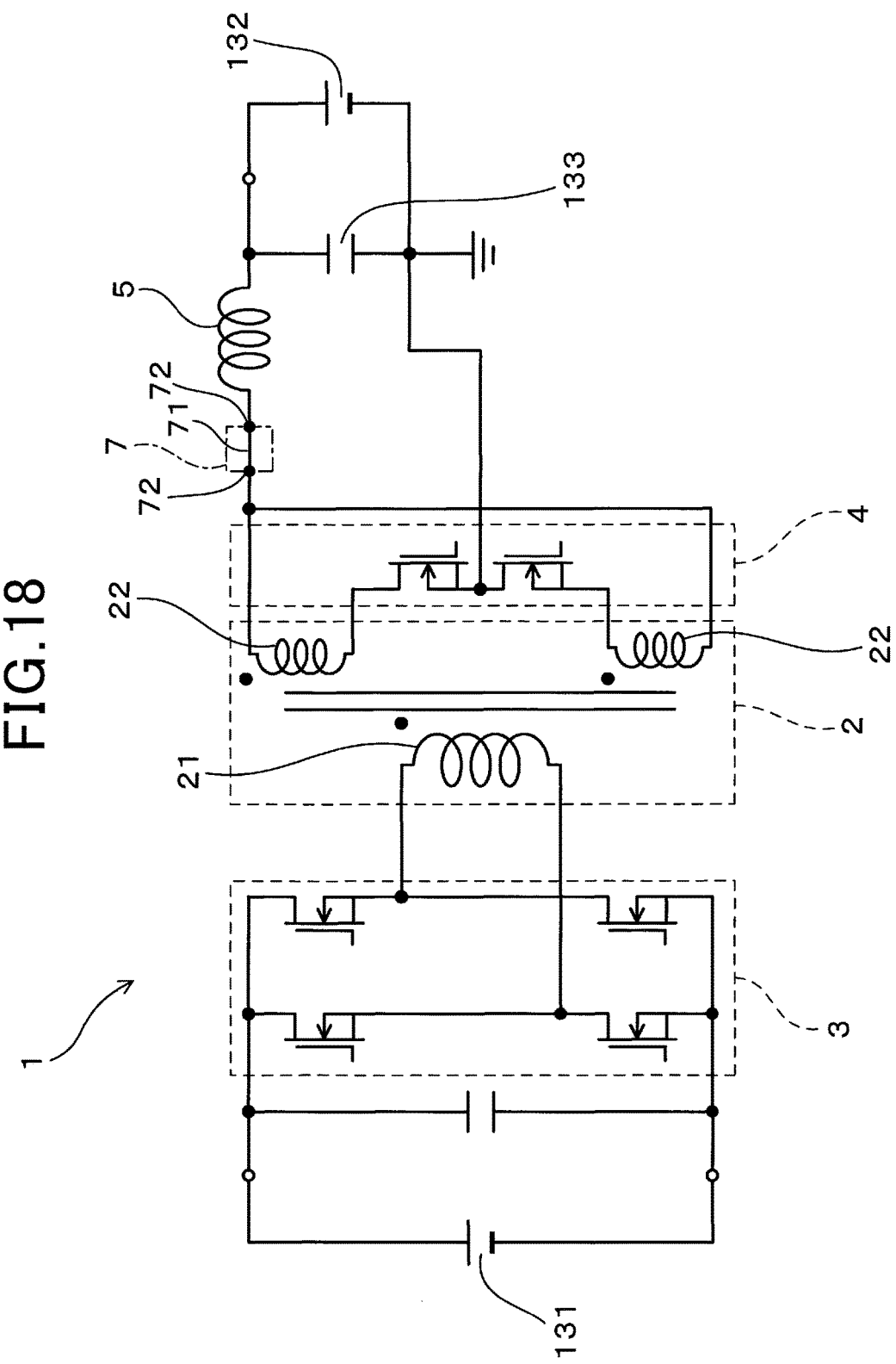
FIG. 18 is a circuit diagram of the power supply device according to the fifth embodiment.

According to the present embodiment, as illustrated in FIG. 17 and FIG. 18, the transformer 2 and the choke coil 5 are electrically connected to each other via the connection terminal portions 72 and the conductive body portion 71.

Specifically, as illustrated in FIG. 17, the connecting member 7 is configured such that the plurality of connection terminal portions 72 which are connect to each other via the conductive body portion 71, protrude to the upper side thereof. Furthermore, one section of the plurality of these connection terminal portions 72 is connected to the transformer 2, and another section of the plurality of these connection terminal portions 72 is connected to the choke coil 5. As a result, the transformer 2 and the choke coil 5 are electrically connected to each other.

A circuit configuration of the power supply device 1 according to the present embodiment, shown in FIG. 18, is conceivable, for example. In this circuit configuration, terminals of the secondary coils 22 of the transformer 2 are connected to one of the terminals of the choke coil 5. The conductive body portion 71 and the connection terminal portions 72 of the connecting member 7 are interposed between the transformer 2 and the choke coil 5 as connecting wires therebetween.

Other configuration features are the same as those of the first embodiment. Also according to the present embodiment, a power supply device which can achieve downsizing, noise reduction, and improvement in heat dissipation efficiency can be obtained.

Sixth Embodiment

Figure 19:
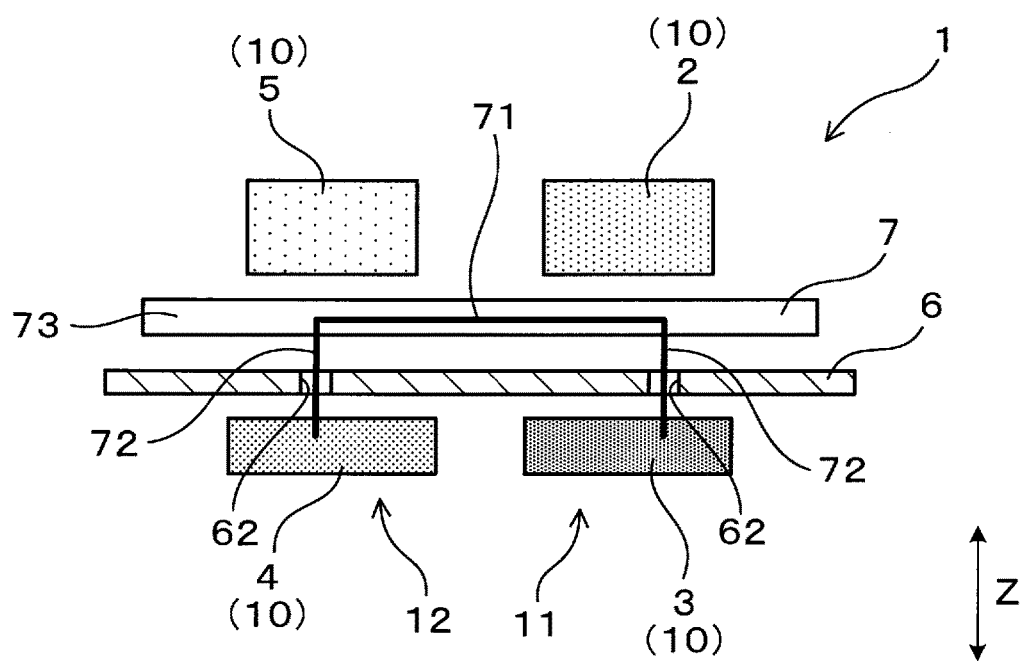
FIG. 19 is a schematic cross-sectional view of a power supply device according to a sixth embodiment.
Figure 20:
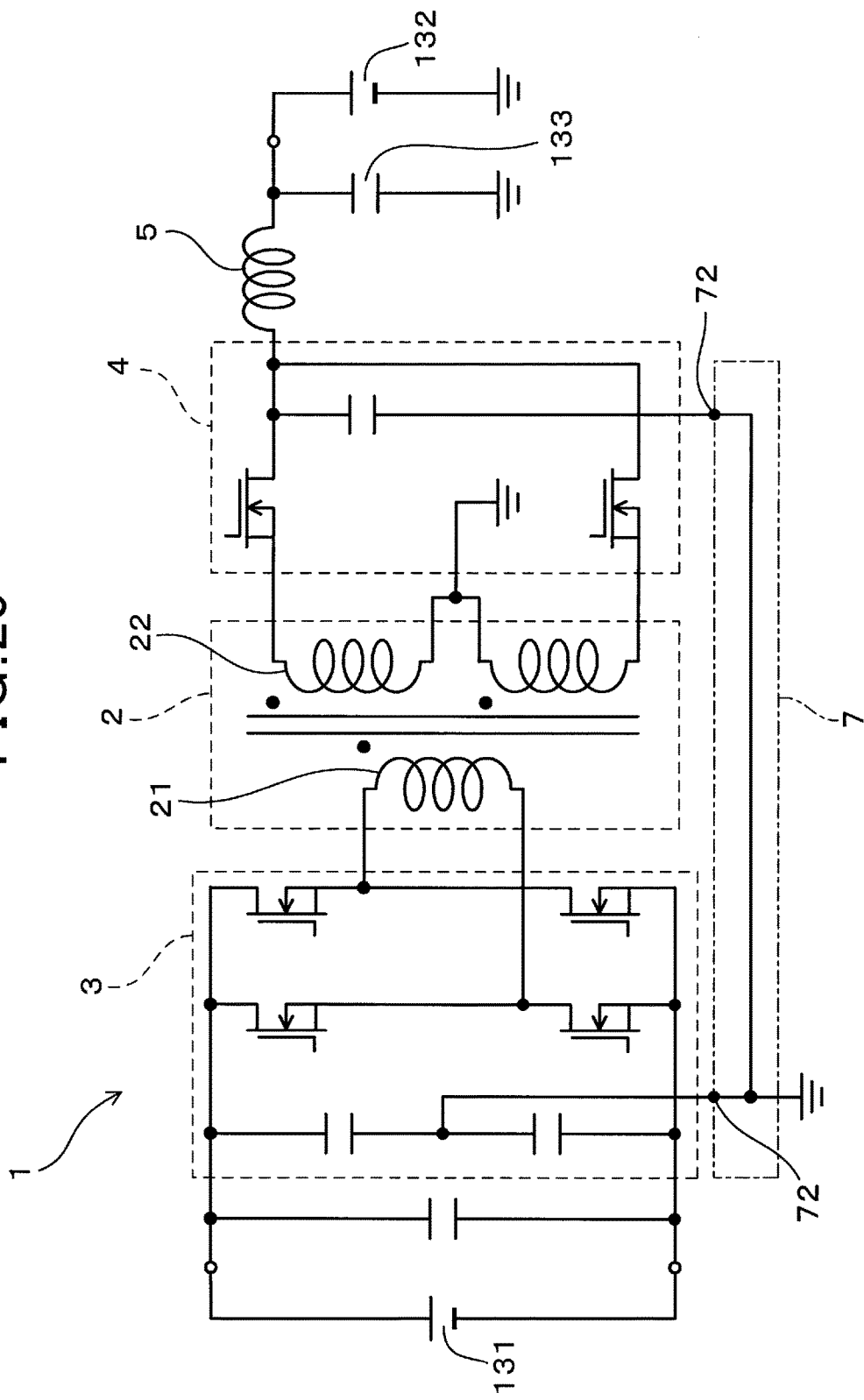
FIG. 20 is a circuit diagram of the power supply device according to the sixth embodiment.

According to the present embodiment, as illustrated in FIG. 19 and FIG. 20, the primary semiconductor component 3 and the secondary semiconductor component 4 are electrically connected to each other via the connection terminal portions 72 and the conductive body portion 71.

Specifically, the connecting member 7 is provided such that the plurality of connection terminal portions 72 connected to each other via the conductive body portion 71 are configured to protrude to the lower side. Further, ones of the plurality of these connection terminal portions 72 are connected to the primary semiconductor component 3, and other ones of the plurality of these connection terminal portions 72 are connected to the secondary semiconductor component 4. With this, the primary semiconductor component 3 and the secondary semiconductor component 4 are electrically connected to each other.

A conceivable configuration of, for example, of a circuit of a power supply device 1 is shown in FIG. 20. In this circuit configuration, the primary semiconductor component 3 is formed by integrating four MOSFETs and two capacitors with each other. Furthermore, the secondary semiconductor component 4 is formed by integrating two MOSFETs and a capacitor. In addition, a wiring part between the two capacitors in the primary semiconductor component 3, and one of terminals of the capacitor in the secondary semiconductor component 4 are electrically connected to each other and grounded. The connection wiring part mentioned here is formed of the conductive body portion 71 and the connection terminal portions 72 of the connecting member 7.

Other configuration features are the same as those of the first embodiment. Also a power supply device according to the present embodiment in which downsizing, and noise reduction are achieved, and improvement in heat dissipation efficiency obtained may be provided.

The present disclosure is not limited to the embodiments described hereinabove, and is applicable to various other embodiments without departing from the scope thereof.

For example, each of configuring elements described in the third embodiment may be adopted to the other embodiments. Specifically, the configuring elements of the third embodiment, such as the configurations of the connecting member 7, the electronic components 10, and the circuit board 6, are may also be adopted to the other embodiments.

Also, as disclosed in the embodiments hereinabove, the first stacked body 11 is formed of the transformer 2 and the primary semiconductor component 3, and the second stacked body 12 is formed of the choke coil 5 and the secondary semiconductor component 4. However, the combinations of the electronic components 10 of the first stacked body 11 and the second stacked body 12 are not limited thereto, and other combinations may be employed. Furthermore, the arrangement of the electronic components 10 with respect to the circuit board 6 may be variously changed.

In addition, the connecting member 7 is arranged above the circuit board 6 in the embodiments described hereinabove, but this arrangement relationship may be inverted.

What is claimed is:

1. A power supply device, comprising: a transformer including a primary coil and secondary coil and cores;
   a primary semiconductor component forming a primary circuit connected to the primary-coil side of the transformer;
   a secondary semiconductor component forming a secondary circuit connected to the secondary-coil side of the transformer;
   a choke coil forming the secondary circuit cooperatively with the secondary semiconductor component, the choke coil including a coil portion and cores; and
   a circuit board on which a control circuit is formed,
   wherein, the transformer, the primary semiconductor component, the secondary semiconductor component, and the choke coil are electronic components, the electronic components are disposed in pairs, two by two, to form a first stacked body and a second stacked body,
   one pair of the electronic components forming the first stacked body and another pair of the electronic components forming the second stacked body are stacked in a normal direction of the board, and the circuit board is intervened between the one pair of the electronic components forming the first stacked body and the other pair of the electrical components forming the second stacked body.

2. The power supply device according to claim 1, further comprising a connecting member, the connecting member electrically connecting either one of a plurality of electronic components to each other, and the electronic components and the circuit board to each other,
   wherein the connecting member is interposed between the pair of electronic components forming the first stacked body, and other pair of electronic components forming the second stacked body.

3. The power supply device according to claim 2, wherein the connecting member includes a conductive body portion, and a plurality of connection terminal portions which are configured to extend from the conductive body portion in the normal direction of the board, and among the plurality of electronic components and the circuit board at least two members are connected to the connection terminal portions.

4. The power supply device according to claim 3, wherein the first stacked body is formed of the transformer and either one of the primary semiconductor component and the secondary semiconductor component, the second stacked body is formed of the choke coil and either one of the secondary semiconductor component and the primary semiconductor component, and
   the transformer and the choke coil are arranged on a same surface side of the circuit board.

5. The power supply device according to claim 4, wherein the circuit board and at least one of the transformer and the choke coil are electrically connected to each other via the connection terminal portion and the conductive body portion.

6. The power supply device according to claim 5, wherein there is provided a connection between the connection member and the circuit board, the connection being provided via the through-hole formed on the circuit board and the connection terminal portion which is inserted through the through hole.

7. The power supply device according to claim 6, wherein the connection terminal portion has a press-fitting structure that is deformable in a radial direction, and the connection terminal portion is press welded to an inner wall surface of the through-hole.

8. The power supply device according to claim 5, wherein either one of the transformer and the choke coil includes a printed circuit board onto which at least one part of a coil portion is formed, and a connection between the connecting member and either one of the transformer and the choke coil is provided via a through-hole which is formed on the printed circuit board, and via the connection terminal portion which is inserted into the through-holes.

9. The power supply device according to claim 8, wherein the connection terminal portion has a press-fitting structure that is deformable in a radial direction, and the connection terminal portion is press welded to an inner wall surface of the through-hole.

10. The power supply device according to claim 5, wherein there is provided an electrical connection between at least one of the transformer and the primary semiconductor component, the transformer and the secondary semiconductor component, the choke coil and the secondary semiconductor component, and the choke coil and the primary semiconductor component, the electrical connection being provided via the connection terminal portion and the conductive body portion.

11. The power supply device according to claim 4, wherein there is provided an electrical connection between at least one of the transformer and the primary semiconductor component, the transformer and the secondary semiconductor component, the choke coil and the secondary semiconductor component, and the choke coil and the primary semiconductor component, the electrical connection being provided via the connection terminal portion and the conductive body portion.

12. The power supply device according to claim 4, wherein at least one of the primary semiconductor component and the secondary semiconductor component, is electrically to the circuit board via the connection terminal portion and the conductive body portion.

13. The power supply device according to claim 3, wherein at least one of the primary semiconductor component and the secondary semiconductor component is directly mounted to the circuit board.

14. The power supply device according to claim 13, wherein the at least one of the primary semiconductor component and the secondary semiconductor component includes lead terminals that are inserted into through-holes formed on the circuit board.

15. The power supply device according to claim 14, wherein the connection terminal portion have a press-fitting structure that is deformable in a radial direction, and is press welded to an inner wall surface of the through-hole.

16. The power supply device according to claim 3, wherein the transformer and the choke coil are electrically connected to each other via the connection terminal portions and the conductive body portion.

17. The power supply device according to claim 3, wherein the primary semiconductor component and the secondary semiconductor component are electrically connected to each other via the connection terminal portion and the conductive body portion.

18. The power supply device according to claim 3, wherein the connecting member includes a ground bus bar to be grounded.

19. The power supply device according to claim 2, wherein a mounting component which is different from the electronic components is mounted to the circuit board, and the mounting component is disposed at a position that does not overlap with any of the electronic components and the connecting member, when viewed in the normal direction of the board.

20. The power supply device according to claim 2, wherein the connecting member includes a sealing portion which is formed by sealing at least one part of the conductive body portion with a resin;

the conductive body portion is in a state such that the connection terminal portions is exposed, and the sealing portion is supported, and the sealing portion is supported by the one pair of the electric components of the first stacked body and the other pair of the electronic components of the second stacked body on both sides thereof, in the normal direction of the board.

* * * * *